(12) United States Patent
Misawa et al.

(10) Patent No.: US 7,248,092 B2
(45) Date of Patent: Jul. 24, 2007

(54) CLAMP CIRCUIT DEVICE

(75) Inventors: Katsutoyo Misawa, Nukata-gun (JP); Yasuyuki Ishikawa, Kariya (JP); Akira Suzuki, Nukata-gun (JP); Yoshinori Teshima, Toyota (JP); Hideaki Ishihara, Okazaki (JP); Toshiharu Muramatsu, Nishio (JP)

(73) Assignee: DENSO CORPORATION, Kariya (JP)

( * ) Notice: Subject to any disclaimer, the term of this patent is extended or adjusted under 35 U.S.C. 154(b) by 64 days.

(21) Appl. No.: 11/073,564

(22) Filed: Mar. 8, 2005

(65) Prior Publication Data

US 2005/0206429 A1    Sep. 22, 2005

(30) Foreign Application Priority Data

Mar. 22, 2004  (JP) ............................. 2004-082579
Mar. 30, 2004  (JP) ............................. 2004-099470
Sep. 2, 2004   (JP) ............................. 2004-255619

(51) Int. Cl.
  *H03K 5/08*    (2006.01)
(52) U.S. Cl. ........................ 327/313; 327/309; 327/317

(58) Field of Classification Search ..................... None
See application file for complete search history.

(56) References Cited

U.S. PATENT DOCUMENTS 6,653,884 B2    11/2003    Fujii et al. .................. 327/319
6,714,062 B2 *   3/2004    Kappes ....................... 327/321
6,737,905 B1     5/2004    Noda et al. ................. 327/323

* cited by examiner

*Primary Examiner*—Quan Tra
*Assistant Examiner*—Khareem E. Almo
(74) *Attorney, Agent, or Firm*—Posz Law Group, PLC (57) ABSTRACT

In a clamp circuit device, reference voltages are set up by a series circuit of an FET, a resistor and an FET. Gate potentials of FETs are set up by performing addition and subtraction of these reference voltages and a reference voltage generated by a bandgap reference circuit, respectively. The clamp circuit device is constructed by connecting together a source of the one FET with its drain connected with the power supply and a source of the other FET with its drain connected with the ground to an input terminal of a control IC unit. Thus, an input voltage is clamped to [V4+Vtp] when an excessive voltage of positive polarity is applied to an input terminal, and the input voltage is clamped to [V5−Vtn] when an excessive voltage of negative polarity is applied.

4 Claims, 7 Drawing Sheets

FIG. 6
PRIOR ART

CLAMP CIRCUIT DEVICE

CROSS REFERENCE TO RELATED APPLICATION

This application is based on and incorporates herein by reference Japanese Patent Applications No. 2004-82579 filed on Mar. 22, 2004, No. 2004-99470 filed on Mar. 30, 2004 and No. 2004-255619 filed on Sep. 2, 2004.

FIELD OF THE INVENTION

This invention relates to a clamp circuit device that clamps a voltage inputted to a signal input terminal of a semiconductor integrated circuit device. Moreover, this invention relates to an input interface circuit of a semiconductor integrated circuit device that is constructed to prevent a circuit element from being destroyed when a high voltage higher than a power supply voltage is applied to its input terminal.

BACKGROUND OF THE INVENTION

In recent years, regarding large-scale semiconductor integrated circuit devices (LSIs), micronization (size reduction) of circuit elements is being advanced in order to enhance the operating speed further and reduce the area of a chip. For example, when an LSI is constructed using MOS devices, the thickness of a gate oxide film becomes thinner with micronization of circuit elements. Therefore, it becomes necessary to lower a gate application voltage in order to secure a sufficient element life, and also to prevent an excessive voltage from being applied to the element in order to avoid breakdown of the element.

For element life, it is effective to reduce the power supply voltage using a step-down circuit. This measure is mainly used in inside logic circuits of the LSI. For excessive voltages, it is effective to add a clamp circuit to a, buffer circuit or interface circuit provided between an external signal input terminal and the internal circuit or to add a clamp circuit outside the LSI. Such a clamp circuit is proposed in U.S. Pat. No. 6,737,905 (JP 2003-258581A).

According to this clamp circuit, external parts of an integrated circuit device become unnecessary except for a current limiting resistor etc., and consequently the area of a substrate can be reduced and the cost can be curtailed. Moreover, an input voltage detection circuit and a reference voltage generator circuit can set a clamp starting voltage to a desired value by properly setting structures of resistor circuits. In addition, these circuits have an advantage that the clamp starting voltage is resistant to fluctuate etc.

This clamp circuit is constructed so that an offset voltage for setting the clamp starting voltage is determined by a relationship among transistors of source follower connection and resistors. However, with a structure like this, the clamp starting voltage is resistant to fluctuate, the circuit cannot avoid being affected from variations in constants of the source follower transistors and the resistors, and hence there is a limit in controlling the clamp starting voltage accurately.

Figure 5:
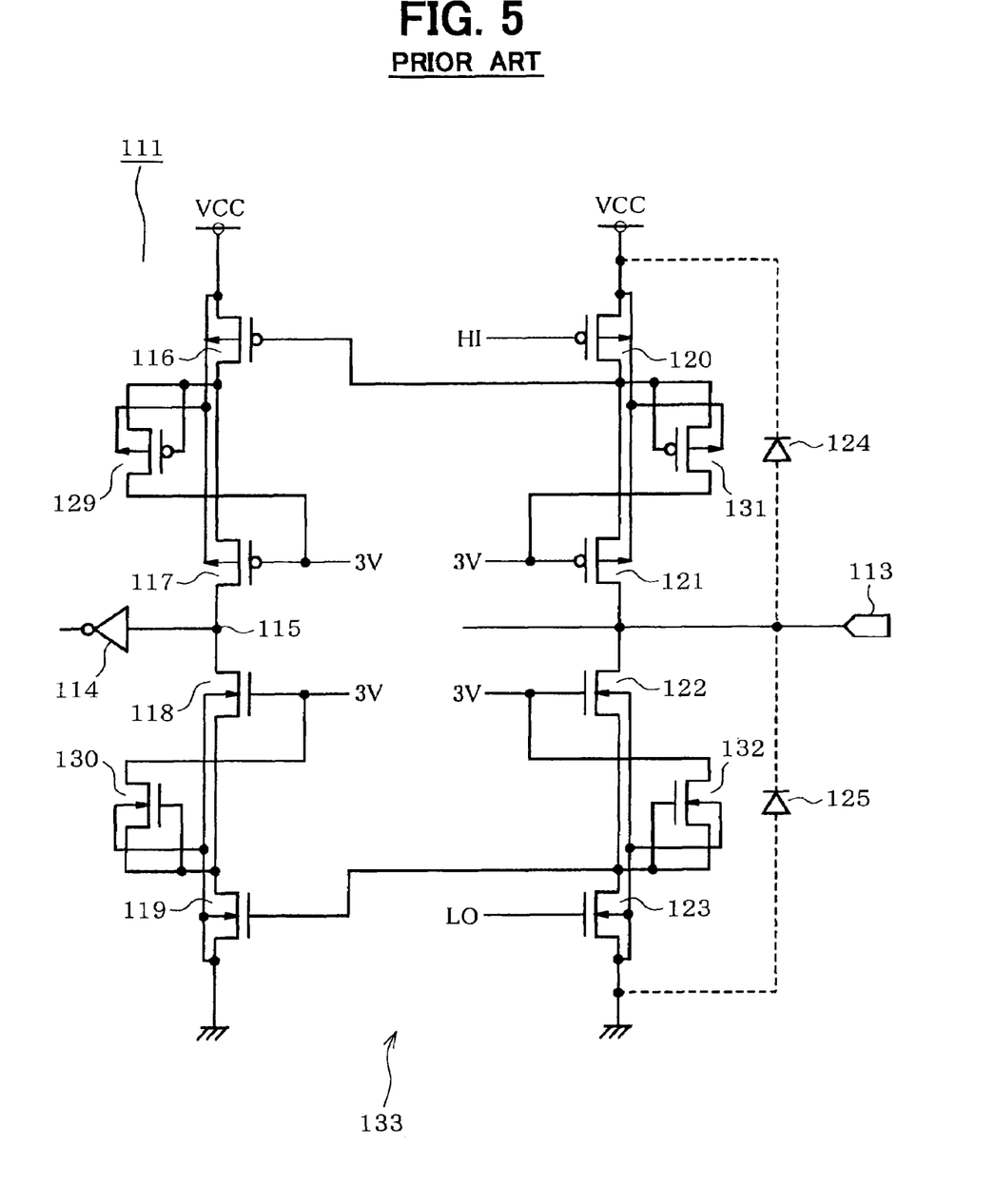
FIG. 5 is a wiring diagram showing a prior art input interface circuit.

As another countermeasure to excessive input voltages, an input interface circuit of a semiconductor integrated circuit device is proposed in U.S. Pat. No. 6,653,884 (JP 2002-43924A). FIG. 5 shows a structure of this interface circuit. A signal transferred to an input terminal (external input terminal) 113 of a microcomputer (semiconductor integrated circuit device) 111 from the outside is transferred to an input terminal (internal input terminal) 115 of an inverter 114 that constitutes an internal circuit of the microcomputer 111. Between the power supply VCC and the input terminal 115, a series circuit of P-channel MOSFETs (first and second P-MOSFETs) 116 and 117 is connected. Between the input terminal 115 and the ground, a series circuit of N-channel MOSFETs (first and second N-MOSFETs) 118 and 119 is connected.

On the other hand, between the power supply VCC and the input terminal 113, a series circuit of a P-channel MOSFET 120 (fourth P-MOSFET) and a P-channel MOSFET 121 (third P-MOSFET) is connected; between the input terminal 113 and the ground, a series circuit of an N-channel MOSFET 122 (third N-MOSFET) and an N-channel MOSFET (fourth N-MOSFET) 123 is connected.

Moreover, between the power supply VCC and the input terminal 113, a parasitic diode 124 formed in the semiconductor substrate in connection with formation of FETs 120 and 121 is connected. Between the input terminal 113 and the ground, a parasitic diode 125 formed in the semiconductor substrate in connection with formation of FETs 122 and 123 is connected. A high-level signal is always provided to a gate of the FET 120, and a low-level signal is always provided to a gate of the FET 123. This is adopted when each gate is used as an input interface.

A gate of the FET 116 is connected to a common junction point of the FETs 120 and 121, and a gate of the FET 119 is connected to the common junction point of the FETs 122 and 123. The voltage of the power supply VCC is 5V, and the intermediate potential 3V is applied to gates of the FETs 117, 118, 121 and 122. This intermediate potential 3V is generated from the power supply VCC as a power supply for operating the microcomputer 111 in the case where a core part of the microcomputer 111 is constructed to operate at 3V (actually, 3.3V).

A source of a P-channel MOSFET (fifth P-MOSFET, MOSFET for protection) 129 is connected to a common junction point of the FETs 116 and 117 along with its gate, and a drain of the FET 129 is connected to the gate of the FET 117. A source of an N-channel MOSFET (fifth N-MOSFET, MOSFET for protection) 130 is connected to a common junction point of the FETs 118 and 119 along with its gate, and a drain of the FET 130 is connected to the gate of the FET 118.

The drain of a P-channel MOSFET (sixth P-MOSFET, MOSFET for protection) 131 is connected to a common junction point of the FETs 120 and 121 along with its gate, and a source of the FET 131 is connected to a gate of the FET 121. A drain of an N-channel MOSFET (sixth N-MOSFET, MOSFET for protection) 132 is connected to a common junction point of the FETs 122 and 123 along with its gate, and a source of the FET 132 is connected to a gate of the FET 122. The above structure constitutes an input interface circuit 133.

According to the above input interface circuit 133, even when a high voltage of positive polarity or negative polarity is applied to the input terminal 113, a voltage higher than the power supply voltage 5V is not applied on gate oxide films of the FETs. Consequently, the input interface circuit 133 eliminates the need for a process to form a thick gate oxide film that makes a part of the FETs structurally high-voltage resistive, which makes possible to eliminate a manufacturing process and reduce the cost.

Moreover, in case the potential of the line path that has high impedance when both of the two FETs connected in series are turned off, the input interface circuit can prevent each FET from being destroyed. This interface circuit 133 is applied to a semiconductor integrated circuit (IC) mounted on a vehicle.

Figure 6:
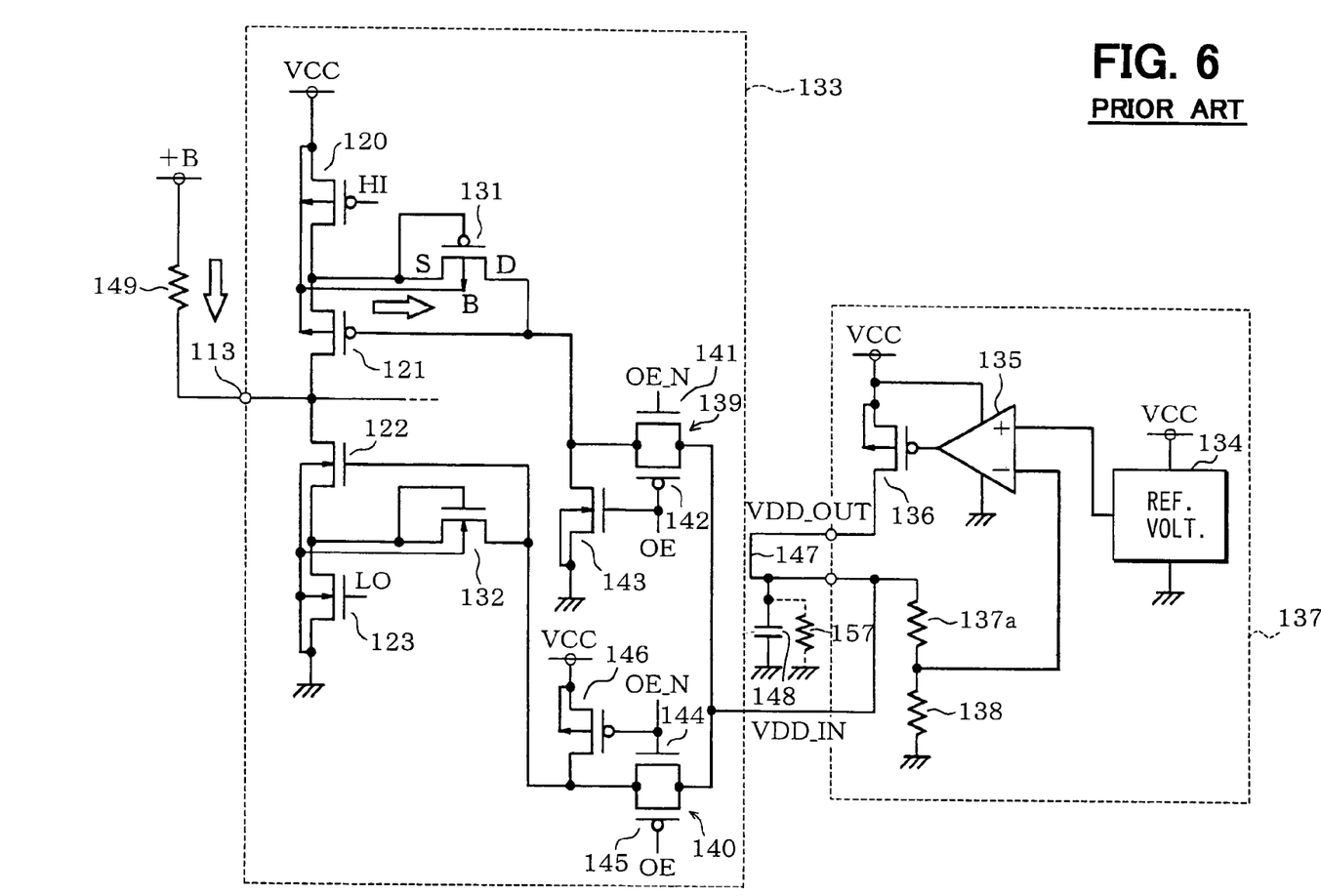
FIG. 6 is a wiring diagram showing a principal part of the prior art input interface circuit shown in FIG. 5.

For example, as shown in FIG. 6, the following case is considered. The operating power supply voltage VCC of an IC is 5V, and the input interface circuit 133 is applied to the multi-purpose input terminal 113 that is connected to the battery voltage +B of 12V through a resistor. FIG. 6 shows only an input side of the input interface circuit 133 and clearly illustrates a circuit part that generates and impresses an intermediate potential of 3V.

A reference voltage generation circuit 134 generates a reference voltage based on the power supply VCC, and outputs it to the non-inverting input terminal of an operational amplifier 135. Between the power supply VCC and the ground, a series circuit of a P-MOSFET 136 and resistors 137a, 138 is connected. A common junction point of the resistors 137a, 138 is connected to the inverting input terminal of the operational amplifier 135, and the output terminal of the operational amplifier 135 is connected to a gate of the FET 136. The above structure constitutes a voltage generation circuit 137 that is a series regulator. An intermediate potential of 3V is supplied from a drain of the FET 136.

The intermediate potential (intermediate voltage) VDD generated by the voltage generation circuit 137 is applied through intermediate voltage application switch units 139 and 140. The switch unit 139 on the power supply side includes an N-MOSFET 141 and a P-MOSFET 142 with their output-side terminals mutually connected. One of them is connected to the output terminal of the voltage generation circuit 137, and the other is connected the gate of the FET 121. Moreover, the gate of the FET 121 is connected to the ground through an N-MOSFET 143, and a gate of the FET 143 is connected with a gate of the FET 142 in common. The output enable signal OE is provided to the gates of the FETs 142 and 143, and its inverted signal OE_N is provided to a gate of the FET 141.

On the other hand, the switch unit 140 on the ground side includes an N-MOSFET 144 and a P-MOSFET 145 with their output-side terminals mutually connected. One of them is connected to the voltage generation circuit 137 and the other is connected to the gate of the FET 122. Moreover, the gate of the FET 122 is connected to the power supply VCC through a P-MOSFET 146, and a gate of the FET 146 is connected with a gate of the FET 144 in common. The enable signal OE is provided to a gate of the FET 145, and its inverted signal OE_N is provided to the gates of the FETs 144 and 146.

That is, when the input terminal 113 is used as an input port, the enable signal OE is made to take a low level. At this time, the FET 142 is turned on in the switch unit 139 on the power supply side, and consequently the intermediate voltage VDD is applied to the gate of the FET 121. Then, in the switch unit 140 on the ground side, the FET 145 is turned on, and consequently the intermediate voltage VDD is also applied to the gate of the FET 122.

On the other hand, when the input terminal 113 is used as an output port, the enable signal OE is made to take a high level. At this time, in the switch unit 139 on the power supply side, both of the FETs 141 and 142 are turned off and the FET 143 is turned on. Consequently the gate of the FET 121 is set to the ground potential. Moreover, also in the switch unit 140 on the ground side, both of the FETs 144 and 145 are turned off and the FET 146 is turned on. Consequently the gate of the FET 122 is set to the power supply voltage VCC.

The intermediate voltage VDD generated and outputted by the voltage generation circuit 137 is supplied to the switch units 139 and 140 through the output terminal VDD_OUT, an external wiring pattern 147, and an input terminal VDD_IN. This is to allow a bypass capacitor 148 to be externally attached to the power supply wiring of the voltage VDD.

Moreover, the reason of separation of the output terminal VDD_OUT and the input terminal VDD_IN is that the external wiring pattern 147 is extended so that the noise eliminating capacitor 148 of a relatively large capacitance is connected in a path in which the power supply current flows, which allows the capacitor 148 to exert its noise eliminating action more effectively. Therefore, for some ICs that do not need these measures, it is not necessary to take out the intermediate voltage VDD to the outside.

To prevent the capacity of a battery from being exhausted (battery run-out), it is turned out that the above input interface circuit involves the following problem. The input terminal 113 is connected to the battery power supply +B through a resistor 149. In this case, a current depending on the terminal voltage of the resistor 149 flows in the microcomputer 111. Conventionally, this did not become a problem since the amount of current flowing in through the resistor 149 was below a consumed electric current at the time of low consumption power mode (sleep mode, stop mode, etc.) in which the microcomputer 111 was in a standby state.

However, since lower consumed electric current at the time of standby of the microcomputer 111 has been attained, there arises a case where the amount of current flowing in through the resistor 149 exceeds the consumed electric current of the microcomputer 111. In this case, since a source of the FET 120 is connected to the power supply VCC and its gate potential is also at a high level (=VCC), the drain potential, i.e., a source potential of the FET 131, becomes [VCC+VF].

Figure 7:
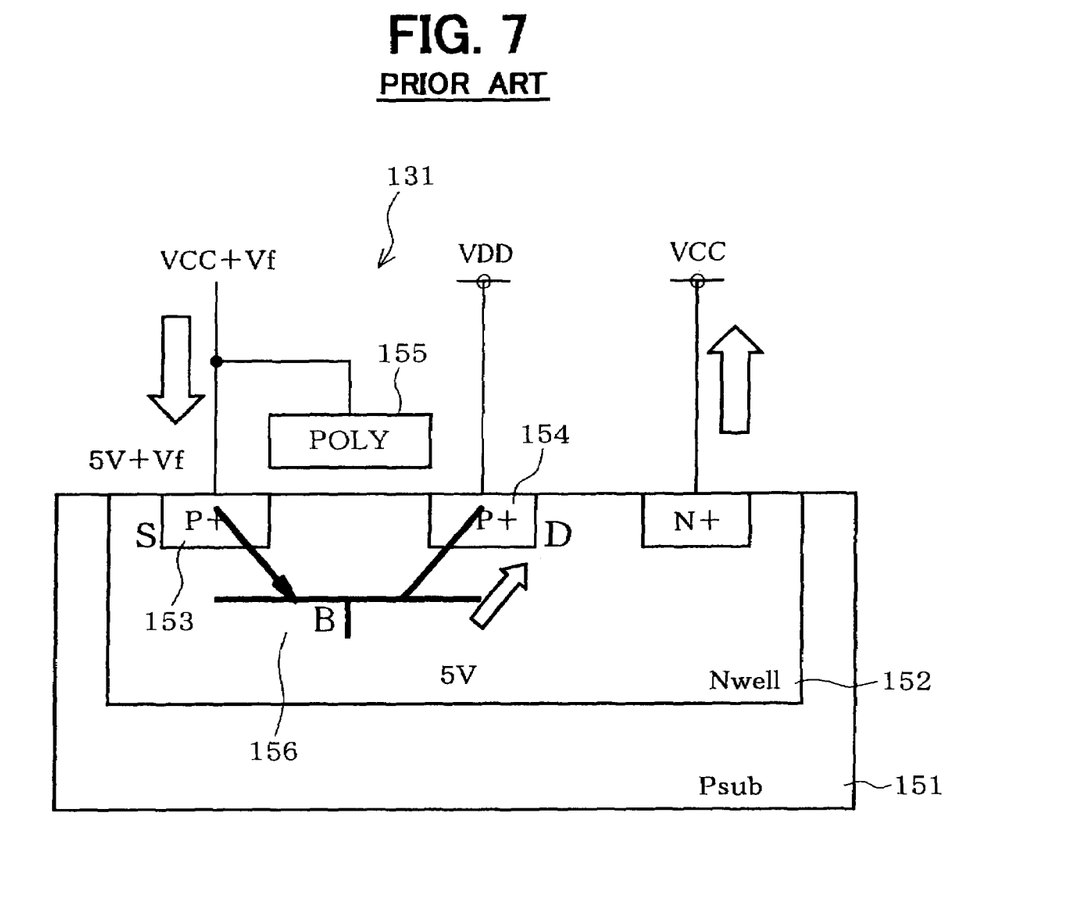
FIG. 7 is a schematic sectional view showing a structure of an FET used in the prior art interface circuit shown in FIG. 5.

FIG. 7 shows a structure of the FET 131 when formed with semiconductors. An N-well 152 is formed on a P-type semiconductor substrate 151, and a P-type source region 153 and a drain region 154 are formed in the N-well 152. A gate electrode 155 is made of polysilicon. Since the substrate potential (back gate) of the N-well 152 is VCC, a parasitic PNP transistor 156 formed with a source region 153 (P), the N-well 152 (N), and a drain region 154 (P) is turned on.

At this time, a path through which a current flows into the drain side of the FET 131, i.e., a supply side of the intermediate voltage VDD, is formed, but a path through which the current is sunk on the ground side does not exist. As a result, it is likely that the intermediate voltage VDD may be raised and even the power supply voltage VCC may be raised. Conventionally, to cope with such a phenomenon, a resistor 157 (shown by a broken line) corresponding to the amount of the injected current is attached externally to the supply terminal of the intermediate voltage VDD, and the resistor 157 consumes the current so that increase in the power supply voltage VCC is prevented.

However, in this measure, it is necessary to determine the resistor value in order to keep the power supply voltage VCC at a prescribed voltage and select the resistor examining its temperature characteristic, manufacture variation, etc. Further, a Zener diode etc. is also necessary for prevention of breakdown of the microcomputer 111, and consequently this measure becomes a cost factor.

SUMMARY OF THE INVENTION

The first object of this invention is to provide a clamp circuit device capable of controlling a clamp starting voltage with a simpler structure.

The second object of this invention is to provide an input interface circuit of a semiconductor integrated circuit device that can prevent increase of a power supply voltage caused by a current flowing into an external input terminal without increasing electric current consumption.

According to this invention for attaining the first object, a power supply voltage is represented by Vdd, a power-supply-side reference voltage by V1(=Vdd−Vh), a clamp control voltage by V2, and a conduction threshold of a power-supply-side clamp element by Vtp. In a clamp circuit device, a power-supply-side clamp element is caused to conduct and perform a clamping operation when a voltage higher than a voltage of [V1+V2+Vtp] is applied to a terminal to be protected (protected terminal). Since the above voltage is [Vdd−Vh+V2+Vtp], the clamp starting voltage is set near [Vdd+V2] when a difference of [Vtp−Vh] is small.

Moreover, representing a ground-side reference voltage by V3(0+V1) and a conduction threshold of a ground-side clamp element by Vtm, a ground-side clamp element is caused to conduct to perform a clamping operation, when a voltage of negative polarity lower than [V3−V2−Vtm] is applied to the protected terminal. Since the above voltage is [V1−V2−Vtm], the clamp starting voltage is set near [−V2] when a difference of [V1−Vtm] is small. That is, the clamp starting voltage is set up practically with the clamp control voltage V2 for either voltage of positive polarity or negative polarity. Therefore, it becomes possible to set up the clamp starting voltage more accurately than before by generating the clamp control voltage V2 stably.

A P-channel MOSFET is caused to conduct when a voltage between its gate and its source exceeds the threshold voltage Vtp. Therefore, the P-channel MOSFET is caused to conduct and clamp the voltage of the protected terminal to [V1+V2+Vtp] when a voltage higher than the threshold voltage Vtp with reference to the gate potential [V1+V2] is applied to the protected terminal (in this case, source).

An N-channel MOSFET is also caused to conduct when a voltage between its source and its gate exceeds a threshold voltage Vtn. Therefore, the N-channel MOSFET is caused to conduct and clamp the voltage of the protected terminal to [V3−V2−Vtn] when a voltage lower than the threshold voltage Vtn with reference to the gate potential [V3−V2] is applied to the protected terminal (in this case, source). Therefore, the clamp starting voltages on the positive polarity side and on the negative polarity side can be lowered by the amounts of threshold voltages Vtp and Vtn with respect to the reference voltages V1 and V3, respectively.

The power-supply-side reference voltage is set to a potential that is lower than power supply voltage Vdd by the source-to-gate threshold voltage Vtp of the P-channel MOSFET. On the other hand, the ground-side threshold voltage is set to a voltage higher than the ground potential by the source-to-gate threshold voltage Vtn of the N-channel MOSFET. Therefore, the reference voltages can be set near the power supply voltage Vdd and near the ground potential (0V), respectively.

When the voltage Vh becomes equal to Vtp, the power-supply-side clamp starting voltage can be set to [Vdd+V2]. Moreover, since V1 becomes equal to Vtn, the ground-side clamp starting voltage can be set to [−V2]. Therefore, the clamp starting voltages on the positive polarity side and on the negative polarity side can be adjusted only with the clamp control voltage V2, without being dependent on the conduction threshold voltage of the FET.

The clamp control voltage is generated by a bandgap reference circuit. That is, since the clamp control voltage is a voltage for regulating the excessive voltage with reference to the power supply voltage and the ground potential, a relatively low-level and stable potential is preferable. Therefore, a stable and appropriate clamp control voltage can be obtained when the bandgap reference circuit is used to generate it.

A voltage obtained by adding the offset voltage of the operational amplifier as the clamp control voltage to the power-supply-side reference voltage is outputted to the output terminal of the voltage-follower circuit on the power supply side. Moreover, a voltage obtained by subtracting the offset voltage of the operational amplifier from the ground-side reference voltage is outputted to the output terminal of the voltage-follower circuit on the ground side. Therefore, the two voltage-follower circuits function as an adder circuit and a subtractor circuit, respectively. Further, the clamp control voltage can be adjusted properly with the offset voltage given by the operational amplifier.

The power supply side and the ground side bypass circuits can prevent large fluctuation in the power supply voltage and the ground potential that results from excessive current inflow into the power supply or excessive current outflow from the ground when the clamp elements are caused to conduct.

When the excessive voltage of positive polarity is applied to the protected terminal, a P-channel FET that is the power-supply-side clamp element is caused to conduct, and a current flows into its drain from its source. At this time, the N-channel FET that is a power-supply-side bypass circuit is caused to conduct, and consequently a current flows into the ground through the N-channel FET. On the other hand, when the excessive voltage of negative polarity is applied to the protected terminal, an N-channel FET that is the ground-side clamp element is caused to conduct, and a current flows into its source (a protected terminal side) from its drain. At this time, the P-channel FET that is a ground-side bypass circuit is caused to conduct, and consequently a current is supplied from the power supply through the P-channel FET. Therefore, by having clamped the excessive voltage, fluctuation in the power supply voltage and the ground potential can be suppressed, avoiding large current inflow into the power supply and large current outflow from the ground.

For attaining the second object, according to this invention, the above clamp circuit device is used for an input interface circuit of a semiconductor integrated circuit.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described below in detail with reference to various embodiments. In the following description, a source and a drain regarding terminals of the MOSFET are defined based on a potential relationship when the FET is turned on and off. However, the source and the drain may be defined differently.

First Embodiment

Figure 1:
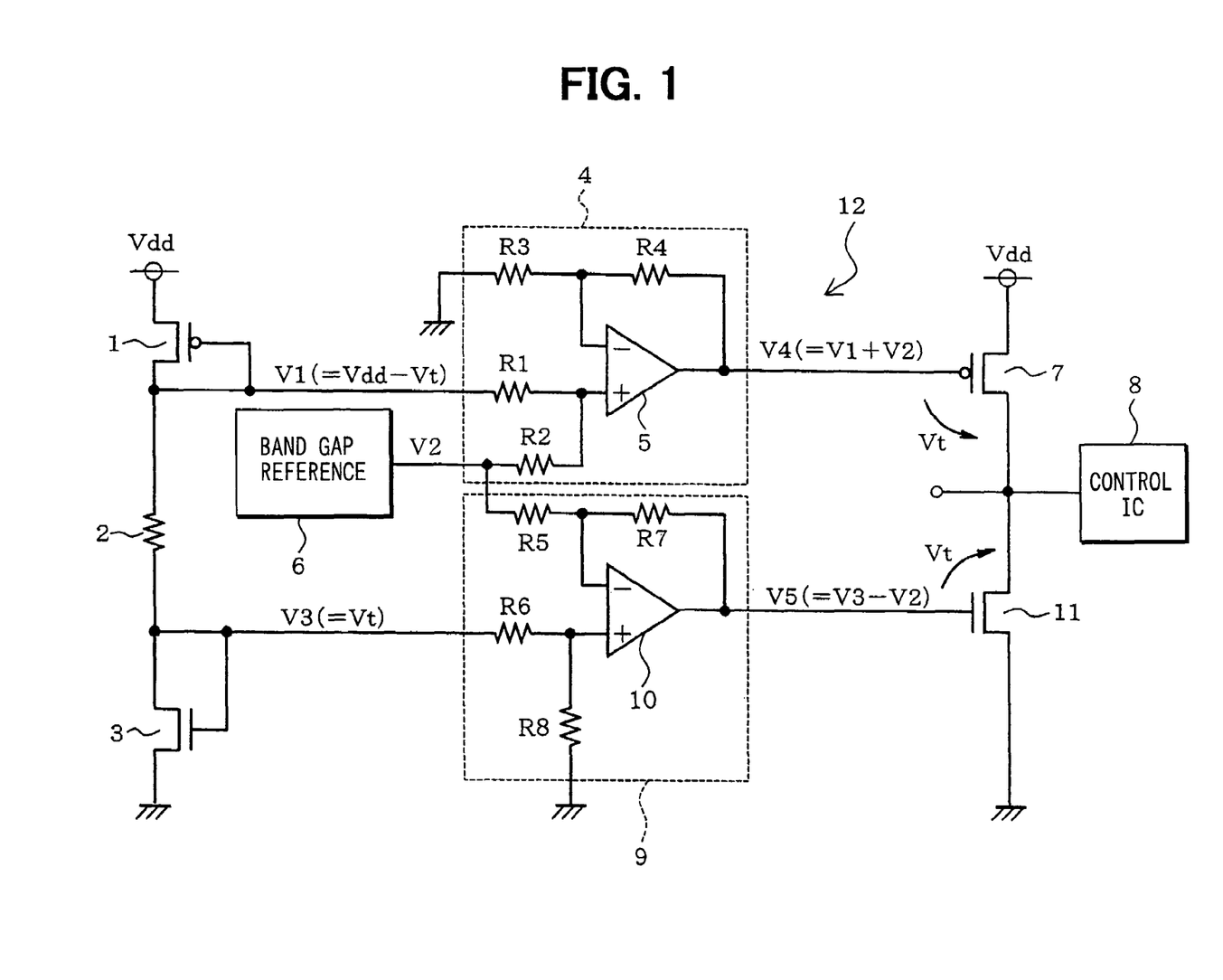
FIG. 1 is a wiring diagram of a clamp circuit device according to a first embodiment of this invention.

Referring first to FIG. 1, a series circuit of a P-channel MOSFET 1, a resistor 2 and an N-channel MOSFET 3 is connected between a power supply Vdd and the ground. A gate and a drain of the FET 1 are connected to the resistor 2. A gate and a drain of the FET 3 are also connected to the resistor 2.

A gate potential of the FET 1 is set to a power-supply-side reference voltage V1. Representing a threshold voltage of the FET 1 by Vtp, the reference voltage V1 is expressed as [Vdd−Vtp]. A gate potential of the FET 3 is set to a power-supply-side reference voltage V3. Representing a threshold voltage of the FET 3 by Vtn, the reference voltage V3 becomes equal to Vtn. The threshold voltages Vtp and Vtn are indicated as Vt in the figures.

The gate of the FET 1 is connected to a non-inverting input terminal of an operational amplifier 5 through a resistor R1 to form an adder circuit 4. Moreover, an output terminal of a bandgap reference (BGR) circuit 6 is connected to the non-inverting input terminal through a resistor R2. The bandgap reference circuit 6 is constructed to generate and output a reference voltage V2 of 0.3V. An inverting input terminal of the operational amplifier 5 is connected to the ground through a resistor R3 and connected to the output terminal through a resistor R4.

An output terminal of the operational amplifier 5 is connected to a gate of a P-channel MOSFET (power-supply-side clamp element) 7. A drain of the FET 7 is connected to the power supply Vdd, and its source is connected to an input terminal (protected terminal) of a control IC unit 8. Therefore, a gate potential V4 of the FET 7 is [V1+V2].

The gate of the FET 3 is connected to a non-inverting input terminal of an operational amplifier 10 through a resistor R6 to form a subtractor circuit 9. Moreover, its non-inverting input terminal is connected to the ground through a resistor R8. An inverting input terminal of the operational amplifier 10 is connected to an output terminal of the bandgap reference circuit 6 through a resistor R5 and connected to the output terminal through a resistor R7.

An output terminal of the operational amplifier 10 is connected to a gate of an N-channel MOSFET (ground-side clamp element) 11. A drain of the FET 11 is connected to the ground, and its source is connected to the input terminal of the control IC unit 8. Therefore, a gate potential V5 of the FET 11 is [V3−V2].

The FETs 7 and 11 are set up so that their threshold voltages may become the same as those of the FETs 1 and 3 for setting a reference voltage. The above structure provides a clamp circuit device 12.

Next, the operation of this embodiment will be described.

<In Case of Application of Excessive Voltage of Positive Polarity to Input Terminal>

A gate potential of the FET 7 is V4 and its threshold voltage is Vtp. When an excessive voltage of positive polarity higher than the threshold voltage Vtp with reference to the gate potential V4 is applied to the source of the FET 7, i.e., the input terminal of the control IC unit 8, the FET 7 is turned on. At this time, a potential of the input terminal is clamped to [V4+Vtp]. Moreover, since V4=V1+V2 and V1=Vdd−Vtp, the clamp starting voltage is [Vdd+V2].

<In Case of Application of Excessive Voltage of Negative Polarity to Input Terminal>

The gate potential of the FET 11 is V5 and the threshold voltage is Vtn. When an excessive voltage of negative polarity that is lower than the threshold voltage Vtn with reference to the gate potential V5 is applied to the source of the FET 11, i.e., the input terminal of the control IC unit 8, the FET 11 is turned on. At this time, the potential of the input terminal is clamped to [V5−Vtn]. Moreover, since V5=V3−V2 and V3=Vtn, the clamp starting voltage is [−V2].

As a result of constructing the clamp circuit device as described above, the clamp starting voltages on the positive side and on the negative side are set up only with the clamp control voltage V2. That is, since the threshold voltage Vt of the FET is likely to change with variations in the manufacture process of the device etc., it is not desirable to set up the clamp starting voltage depending on the threshold voltage Vt. Therefore, the clamp circuit device 12 is constructed in such a manner that the amount of the threshold voltage Vt is canceled out by using FETs having the same threshold voltage Vt in a stage for setting the reference voltages V1, V3 and in the output stage of the clamp circuit device 12. Thus, it becomes possible to set up the clamp starting voltage only with the clamp control voltage V2.

According to this embodiment, the reference voltages V1, V3 are set up by a series circuit of the FET 1, the resistor 2 and the FET 3, and the gate potentials V4 and V5 of the FETs 7 and 11 are set up by performing addition and subtraction on these reference voltages and the reference voltage V2 generated by the bandgap reference circuit 6 with the adder circuit 4 and the subtractor circuit 9, respectively. The source of the FET 7, the drain of which is connected to the power supply, and the source of the FET 11, the drain of which is connected to the ground, are connected to the input terminal of the control IC unit 8 together, whereby the clamp circuit device is constructed.

Further, this clamp circuit device is constructed so that, when an excessive voltage of positive polarity is applied to the input terminal, the voltage is clamped to [V4+Vtp]. The clamp circuit device is constructed so that, when an excessive voltage of negative polarity is applied, the voltage is clamped to [V5−Vtn]. Therefore, the clamp circuit device 12 can be constructed easily with a smaller number of elements than before. Moreover, since the power-supply-side reference voltage V1 and the ground-side reference voltage V3 are set up by the FETs 1 and 3, the voltage V1 can be set to a potential lower than the power supply voltage Vdd by the threshold voltage Vtp, and the voltage V3 can be set to a potential higher than the ground potential by the threshold voltage Vtn.

Furthermore, since the threshold voltages of the FETs 7 and 11 are set equal to the threshold voltages of the FETs 1 and 3, the power-supply-side clamp starting voltage can be set to [Vdd+V2] and the ground-side clamp starting voltage can be set to [−V2]. That is, since the clamp starting voltage can be set up with the clamp control voltage V2 for both an excessive voltage of positive polarity and that of negative polarity, the clamp starting voltage can be set up with higher accuracy by generating the clamp control voltage V2 stably. Further, since the clamp control voltage V2 is generated by the bandgap reference circuit 6, an appropriate reference voltage with extremely excellent stability can be obtained at a relatively low level.

Second Embodiment

Figure 2:
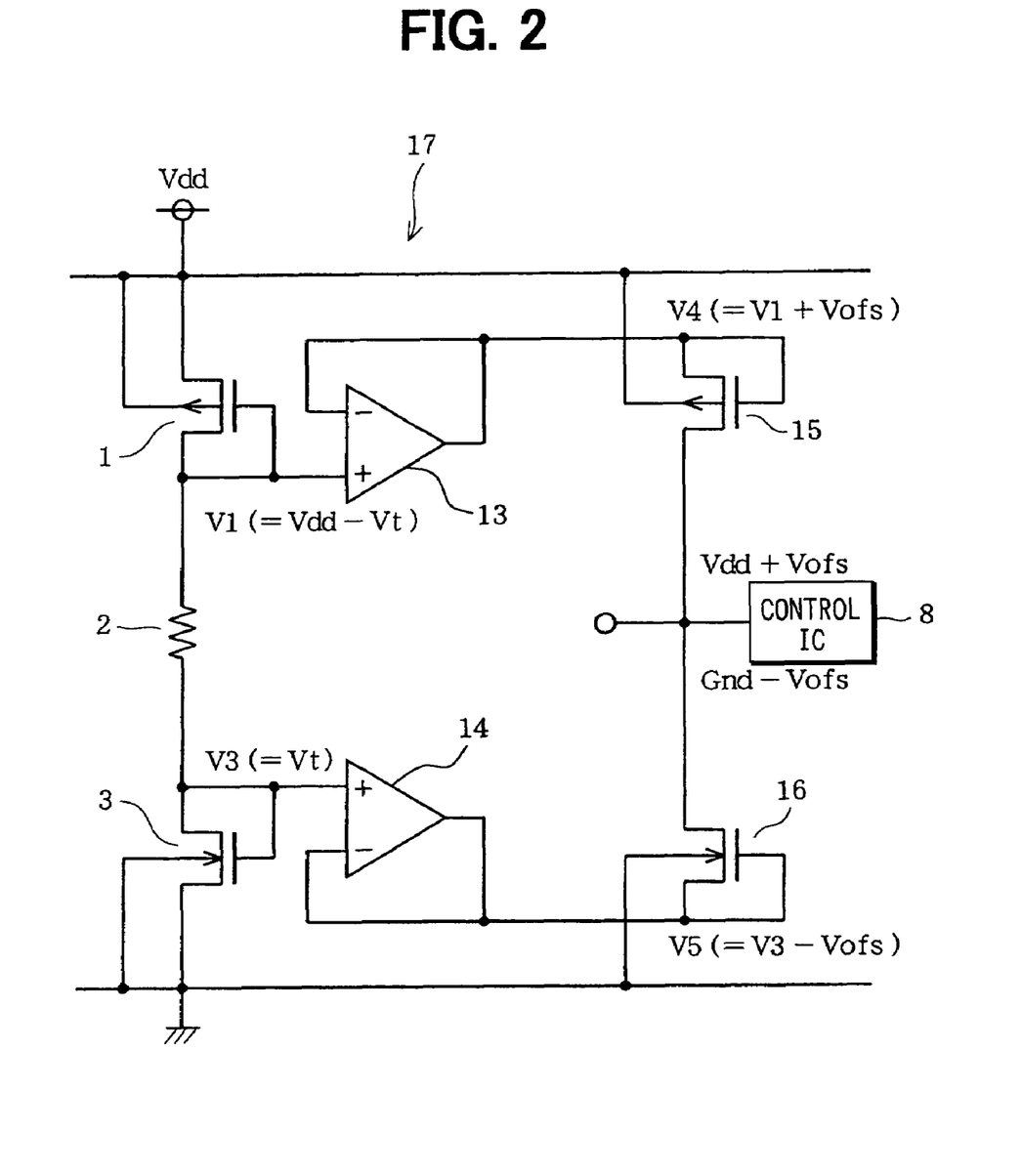
FIG. 2 is a wiring diagram of a clamp circuit device according to a second embodiment of this invention.

A second embodiment is shown in FIG. 2, in which FET elements are shown in different forms from those in the first embodiment. Voltage buffer circuits 13 (adder circuit) and 14 (subtractor circuit) are arranged in place of the adder circuit 4 and the subtractor circuit 9 of the first embodiment, respectively. A P-channel MOSFET (power-supply-side clamp element) 15 and an N-channel MOSFET (ground-side clamp element) 16 are arranged in place of the FETs 7 and 11 in the output stage, respectively.

That is, in an operational amplifier forming the voltage buffer circuit 13 on the power supply side, its non-inverting input terminal is connected to the drain and the gate of the FET 1, and its inverting input terminal, along with the output terminal, is connected to a drain and a gate of the FET 15. Further, the drain of the FET 15 is not connected to the power supply, but only the back gate is connected to the power supply.

On the other hand, the ground-side voltage buffer circuit 14 is connected symmetrically or oppositely to the above. That is, a non-inverting input terminal of the operational amplifier forming the circuit 14 is connected to the drain and gate of the FET 3, and its inverting input terminal is connected to a drain and a gate of the FET 16 along with the output terminal. A drain of the FET 16 is not connected to the ground, but only the back gate is connected to the ground, and sources of the FETs 15 and 16 are connected to the input terminal of the control IC unit 8 together.

Moreover, the operational amplifiers forming the voltage buffer circuits 13 and 14 are constructed so as to provide offset voltages Vofs, respectively. This offset voltage Vofs serves as the clamp control voltage instead of the reference voltage of the bandgap reference circuit 6 in the first embodiment. The above structure forms a clamp circuit device 17.

In operation, the power-supply-side reference voltage V1 and the ground-side reference voltage V3 that are the same amounts as those of the first embodiment are applied to input terminals of the voltage buffer circuits 13 and 14, respectively. Since each operational amplifier gives the offset voltage Vofs, the voltage V4 that is obtained by adding the offset voltage Vofs to the power-supply-side reference voltage V1 is outputted to an output terminal of the voltage buffer circuit 13. On the other hand, the voltage V5 that is obtained by subtracting the offset voltage Vofs from the ground-side reference voltage V3 is outputted to an output terminal of the voltage buffer circuit 14.

That is, by adopting a structure in which the operational amplifiers forming the voltage buffer circuits 13 and 14 provide the offset voltage Vofs, these circuits 13 and 14 perform operation that adds the offset voltage Vofs to the reference voltage V1 or subtract the offset voltage Vofs from the reference voltage V3, respectively.

When the potential of the input terminal of the control IC unit 8 becomes higher than a gate potential [V1+Vofs] of the FET 15 by a threshold voltage Vt of the FET 15, the FET 15 is caused to conduct. Therefore, the excessive voltage of positive polarity applied on the input terminal is clamped to (V1+Vofs)+Vt=Vdd+Vofs.

Then, by this voltage clamping operation, a current flowing to the drain side of the FET 15 is absorbed by an internal circuit of the operational amplifier.

Moreover, when the potential of the input terminal of the control IC unit 8 becomes lower than a gate potential [V3−Vofs] of the FET 16 by a threshold voltage Vt of the FET 16, the FET 16 is caused to conduct. Therefore, the excessive voltage of negative polarity applied on the input terminal is clamped to (V3−Vofs)−Vt=Vdd−Vofs.

As described above, according to the second embodiment, since the voltage buffer circuits 13 and 14 are constructed using operational amplifiers each of which gives a structure to provide an offset voltage Vofs, in place of the adder circuit 4 and the subtractor circuit 9 in the first embodiment, the clamp control voltages can be adjusted properly with the offset voltages, respectively.

Third Embodiment

Figure 3:
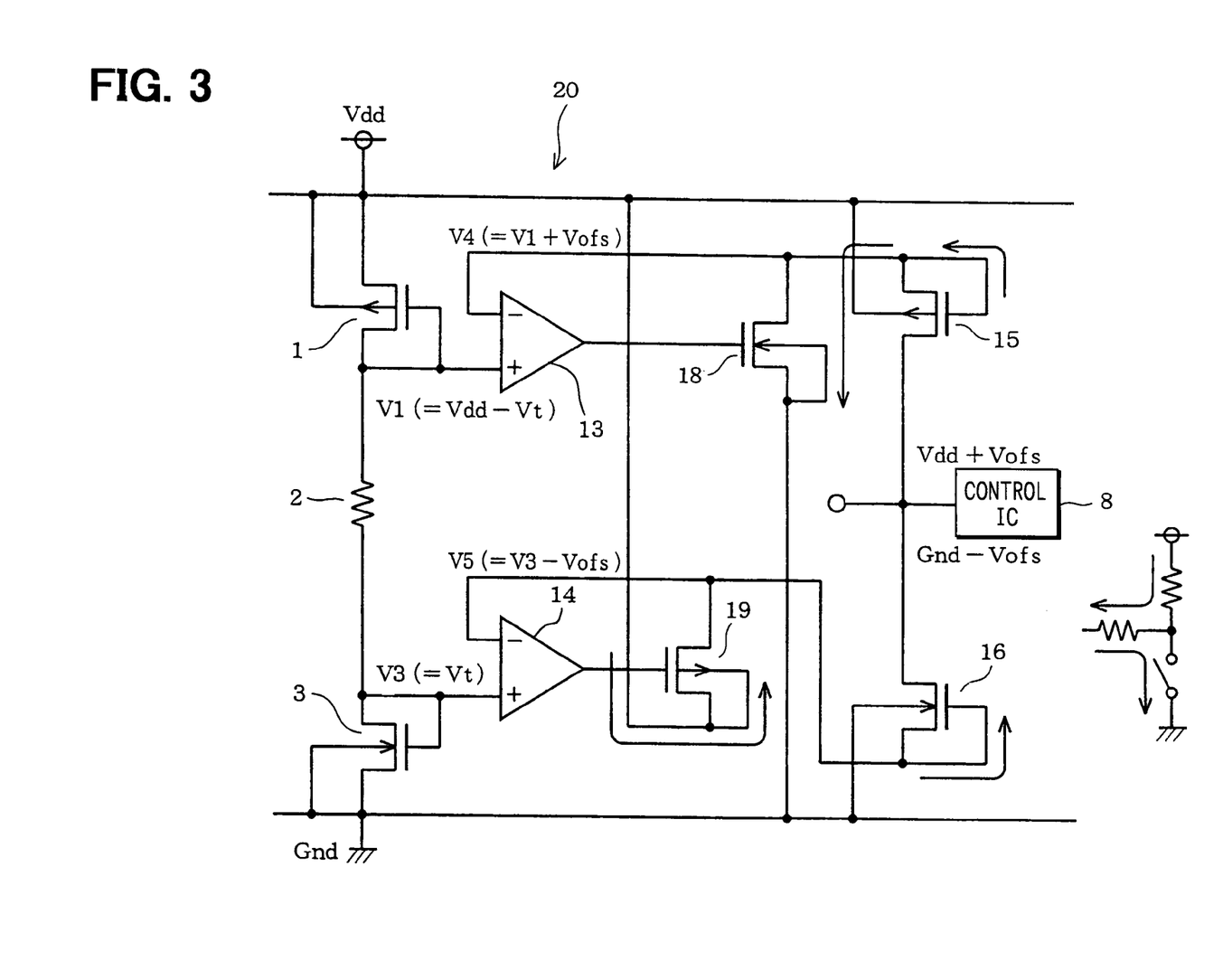
FIG. 3 is a wiring diagram of a clamp circuit device according to a third embodiment of this invention.

In a third embodiment shown in FIG. 3, FETs 18 and 19 are added to the clamp circuit device 17 of the second embodiment for bypassing an excessive current. That is, the output terminal of the operational amplifier forming the power-supply-side voltage buffer circuit 13 is not connected to the inverting input terminal, but connected to a gate of the N-channel MOSFET 18 (power-supply-side bypass circuit). Further, a drain of the FET 18 is connected to the gate of the FET 15, and its source is connected to the ground.

On the other hand, the output terminal of the operational amplifier forming the ground-side voltage buffer circuit 14 is not connected to the inverting input terminal, but connected to a gate of the P-channel MOSFET 19 (ground-side bypass circuit). Further, a drain of the FET 19 is connected to the gate of the FET 16, and its source is connected to the power supply. The above structure provides a clamp circuit device 20.

In operation, the voltage clamping operation is the same as that of the clamp circuit device 17 of the second embodiment when an excessive voltage is applied to the input terminal of the control IC unit 8. When the excessive voltage of positive polarity is applied, a large current may flow from the input terminal through the FET 15. With the structure of the second embodiment, it is assumed that the current cannot be absorbed fully through the internal circuit of the operational amplifier. To cope with this case, in the third embodiment, the FET 18 is disposed and an excessive current is made to flow in the ground side through the FET 18.

In addition, when the excessive voltage of negative polarity is applied and a current tends to flow in the input terminal side of the control IC unit 8 through the FET 16, the current is supplied from the power supply side through the FET 19. Therefore, this circuit structure can prevent the potentials from rising or falling partly and prevent the circuit from being hampered because of circuit's incapability to flow a sufficient current.

Moreover, for example, in the clamp circuit device 12 of the first embodiment, a current resulting from the voltage clamping operation flows into the power supply directly through the FET 7, or into the input terminal of the control IC unit 8 directly from the ground through the FET 11. It is assumed that, when the excessive voltage is simultaneously applied to many input terminals of the control IC unit 8, the amount of current flowing into the power supply or flowing out of the ground becomes large, and potentials of these parts may rise or fall temporarily. However, according to the clamp circuit device 20 of the third embodiment, variation in potentials is prevented by making a current that tends to flow into the power supply side bypass to the ground and by supplying a current that tends to flow out of the ground from the power supply.

As described above, due to the FETs 18 and 19 added to the clamp circuit device 17, the clamp circuit device 20 can prevent fluctuation in the potential of the power supply or the ground that results from excessive current inflow into the power supply or excessive current outflow from the ground, when the FETs 15 and 16 are caused to conduct by the voltage clamping operation.

In the above embodiments, it is not necessarily required that threshold voltages of the FETs 7 and 11 in the first embodiment and threshold voltages of the FETs 15 and 16 in the second and third embodiments are set equal to the threshold voltages of the FETs 1 and 3.

As long as the power-supply-side reference voltage and the ground-side reference voltage are set up so that the former is slightly lower than the power supply voltage Vdd and the latter is slightly higher than the ground potential, any structure may be adopted, regardless of whether these voltages are generated using the FETs 1 and 3. For example, Zener diodes may be used.

The clamp control voltage is not limited to one that is generated using the bandgap reference circuit 6 or the offset voltage of the operational amplifier. It is noted that this voltage only needs to be determined based on a design specification that how clamping operation shall be triggered, that is, by which value the potential applied to the input terminal exceeds the power supply voltage (upper limit) or the ground level (lower limit).

In the second embodiment, the drains of the FETs 15 and 16 need not be connected to the gates but may be connected to the power supply and the ground, respectively, in the same way as the FETs 7 and 11 of the first embodiment.

The clamp element is not limited to the MOSFET, but may be any element as long as it is caused to conduct and performs the clamping operation when a voltage higher than the threshold is applied to it.

Fourth Embodiment

Figure 4:
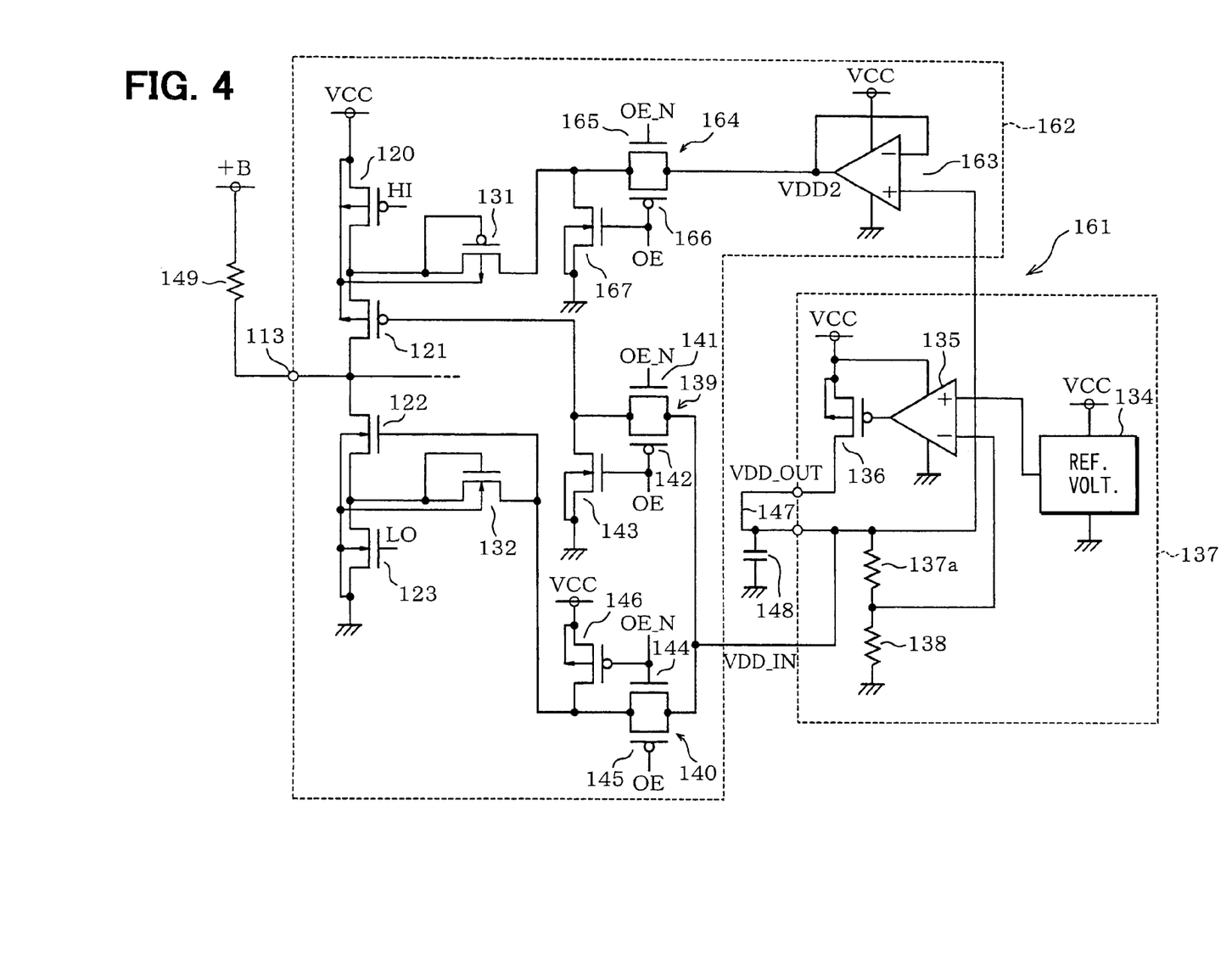
FIG. 4 is a wiring diagram showing an input interface circuit part in a microcomputer according to a fourth embodiment of the invention.

An input interface circuit 162 is built into a microcomputer (semiconductor integrated circuit device) 161 in the fourth embodiment as shown in FIG. 4. This input interface circuit 162 includes, in addition to the conventional input interface circuit 133 shown in FIG. 6, a voltage buffer circuit (voltage rise prevention circuit) 163 and an intermediate potential application switch unit 164. The voltage buffer circuit 163 and the intermediate potential application switch unit 164 are arranged within the microcomputer 161.

The voltage buffer circuit 163 includes an operational amplifier, the non-inverting input terminal of which is connected to the terminal VDD_IN in the microcomputer 161. An inverting input terminal of the operational amplifier is connected to the drain of the FET 131 along with the output terminal through the intermediate potential application switch unit 164.

The intermediate potential application switch unit 164 is constructed in the same way as the switch unit 139. That is, the switch unit 164 is constructed with an N-MOSFET 165 and a P-MOSFET 166 with their output-side terminals mutually connected. One of the terminals is connected to the output terminal of the operational amplifier of the voltage buffer circuit 163, and the other is connected to the drain of the FET 131. The drain of the FET 131 is connected to the ground through an N-MOSFET 167, and a gate of the FET 167 is connected with a gate of the FET 166 together. An output enable signal OE is outputted to the gate of the FET 166, and its inverted signal OE_N is provided to a gate of the FET 165.

Therefore, when the input terminal 113 is used as an input port in the same way as the switch unit 139, the enable signal OE is made to take a low level. Consequently, in the switch unit 164, the FET 166 is turned on, and the intermediate voltage VDD is applied to the drain of the FET 131. When the input terminal 113 is used as an input port, the enable signal OE is made to take a high level. Consequently, both of the FET 165 and the FET 166 in the switch unit 164 are turned off, and the FET 167 is turned on, which makes the drain of FET 131 set to the ground level.

Next, the operation of the fourth embodiment will be described. As described referring to FIGS. 6 and 7, the input terminal 113 is connected to the battery power supply +B through the resistor 149. By this arrangement, when the microcomputer 161 is turned to a standby state in a low power consumption mode, a current flows into the voltage generation circuit (intermediate potential generation circuit) 137 side through the parasitic transistor 156 formed in the FET 131.

At this time, the drain potential of the FET 131, i.e., the output terminal level of the voltage buffer circuit 163, is kept at the intermediate voltage VDD by the operation of the voltage buffer circuit 163. As a result, an excessive current that was injected flows into the ground side through a transistor disposed in an output stage of the operational amplifier of the voltage buffer circuit 163.

Therefore, the transistor disposed in the output stage of the operational amplifier needs to possess a size necessary to allow the injected current to flow into the ground. That is, regarding the external terminal of the microcomputer 161, the size of the transistor is determined so that a sum of injection currents corresponding to the number of all terminals that are pulled up to the battery power supply +B, like the input terminal 113, can be flowed into the ground. In this determination, characteristics of temperature, voltages, etc. and specification variation of the process and parts are considered.

According to the fourth embodiment, the intermediate voltage VDD that the voltage generation circuit 137 generates and outputs is supplied to the drain of the FET 131 through the voltage buffer circuit 163. Therefore, in the case where the input terminal 113 is connected to the battery power supply +B through the resistor 149, even when a current is injected through the FET 131, the voltage buffer circuit 163 sinks the injected current, and keeps an output terminal level at the intermediate voltage VDD.

Therefore, the voltage buffer circuit 163 can prevent the intermediate voltage VDD and the power supply voltage VCC from being raised by the injected current, which eliminates the need for a conventional external resistor 157 shown in FIG. 6 to the microcomputer 161. Thus, a lower cost can be achieved. Moreover, for example, since it is not necessary to raise the amount of consumed electric current at the time of standby of the microcomputer 161 just to consume the injected current, the consumed electric current of the microcomputer 161 can be lowered sufficiently.

In the fourth embodiment, the diode is not limited to one that uses a parasitic diode of a MOSFET, but a diode may be formed separately. The intermediate voltage VDD is not limited to 3V, but may be set up suitably in the range of [0 V+VF]≦VDD≦[VCC−VF].

When the input terminal 113 is used as an input/output terminal, the FETs 120 and 123 may be used as output transistors by providing output signals to their gates from the internal circuit side. Moreover, when the input terminal 113 is used as a terminal for input only, the switch units 139, 140 and 164 are unnecessary, and consequently the intermediate voltage VDD may be applied directly.

For preventing voltage rise, the circuit may be constructed so that the injected current is blocked by disposing a diode in place of the voltage buffer circuit 163. In this case, the intermediate voltage VDD will drop just by the forward voltage VF of the diode. When necessary, this amount may be compensated just by setting the intermediate voltage VDD higher by that amount in advance.

Fifth Embodiment

As an alternative to the fourth embodiment, the clamp circuits 12, 17 and 20 of the first to the third embodiments (FIGS. 1 to 3) may be used in the conventional interface circuit 133 shown in FIGS. 5 and 6. Specifically, each clamp circuit is connected between a common junction point of the first and the second P-MOSFETs 116, 117 and a common junction point of the third and the fourth P-MOSFETs 120, 121, and also between a common junction point of the first and the second N-MOSFETs 118, 119 and a common junction point of the third and the fourth N-MOSFETs 122, 123.

Many other modifications and alterations of the above embodiments will be possible without departing from the spirit of this invention.

What is claimed is:

1. A clamp circuit device comprising:
   an adder circuit for adding a power-supply-side reference voltage set close to a power supply voltage and a predetermined clamp control voltage;
   a subtractor circuit for subtracting the clamp control voltage from a ground-side reference voltage set close to a ground level;
   a power-supply-side clamp element that is connected between a power supply and a protected terminal and is caused to conduct and perform a clamping operation when a voltage of positive polarity higher than its conduction threshold set up based on an output voltage of the adder circuit is applied to the protected terminal;
   a ground-side clamp element that is connected between the ground and the protected terminal and is caused to conduct and perform the clamping operation, when a voltage of negative polarity higher than the conduction threshold set up based on an output voltage of the subtractor circuit is applied to the protected terminal, wherein the power-supply-side clamp element includes a P-channel MOSFET, a gate of which is connected to an output terminal of the adder circuit, wherein the ground-side clamp element includes an N-channel MOSFET, a gate of which is connected to an output terminal of the subtractor circuit; and
   a series circuit of a P-channel MOSFET, a resistor, and an N-channel MOSFET that is connected between the power supply and the ground, wherein a drain and the gate of the P-channel MOSFET are connected to one end of the resistor and also to the input terminal of the adder circuit, and wherein a drain and the gate of the N-channel MOSFET are connected to the other end of the resistor and also to the input terminal of the subtractor circuit to set up the power-supply-side and the ground-side reference voltages.

2. The clamp circuit device according to claim 1, wherein:
   thresholds of both of the P-channel MOSFETs are set equal; and
   thresholds of both of the N-channel MOSFETs are set equal.

3. A clamp circuit device comprising:
   an adder circuit for adding a power-supply-side reference voltage set close to a power supply voltage and a predetermined clamp control voltage;
   a subtractor circuit for subtracting the clamp control voltage from a ground-side reference voltage set close to a ground level;
   a power-supply-side clamp element that is connected between a power supply and a protected terminal and is caused to conduct and perform a clamping operation when a voltage of positive polarity higher than its conduction threshold set up based on an output voltage of the adder circuit is applied to the protected terminal; and
   a ground-side clamp element that is connected between the ground and the protected terminal and is caused to conduct and perform the clamping operation, when a voltage of negative polarity higher than the conduction threshold set up based on an output voltage of the subtractor circuit is applied to the protected terminal, wherein each of the adder circuit and the subtractor circuit includes a voltage buffer circuit and the clamp control voltage is given by an offset voltage of an operational amplifier included in each voltage buffer circuit of the adder circuit and the subtractor circuit;
   a power-supply-side bypass circuit for bypassing a part of a current flowing into the ground side when the power-supply-side clamp element is caused to conduct; and
   a ground-side bypass circuit for bypassing a part of a current flowing from a power supply side when the ground-side clamp element is caused to conduct,
   wherein the power-supply-side clamp element includes a P-channel MOSFET, a source of which is connected to the protected terminal, a gate and a drain of which are connected to an inverting input terminal of the operational amplifier of the adder circuit, and a back gate is connected to the power supply,
   wherein the ground-side clamp element includes an N-channel MOSFET, a source of which is connected to the protected terminal, a gate and a drain are connected to an inverting input terminal of the operational amplifier of the subtractor circuit, and a back gate of which is connected to the ground,
   wherein the power-supply-side bypass circuit includes an N-channel MOSFET that is connected between the gate of the FET forming the power-supply-side clamp element and the ground, a gate of which is connected to the output terminal of the operational amplifier of the adder circuit,
   wherein the ground-side bypass circuit includes a P-channel MOSFET that is connected between the power supply and a gate of the FET forming the ground-side clamp element, a gate of which is connected to the output terminal of the operational amplifier of the subtractor circuit.

4. An input interface circuit of a semiconductor integrated circuit device, comprising:

two diodes, one diode being connected between a power supply and an external input terminal and the other diode being connected between the external input terminal and a ground;

first and second P-MOSFETs connected in series between the power supply and an internal input terminal connected to an internal circuit;

first and second N-MOSFETs connected in series between the internal input terminal and the ground;

a third P-MOSFET connected in series between the external input terminal and a gate of the first P-MOSFET;

a third N-MOSFET connected in series between the external input terminal and a gate of the second N-MOSFET;

a fourth P-MOSFET connected in series along with the third P-MOSFET between the external input terminal and the power supply and on which a gate potential setting a cut-off state is applied;

a fourth N-MOSFET connected in series along with the third N-MOSFET between the external input terminal and the ground and on which a gate potential setting a cut-off state is applied;

an intermediate potential generation circuit for generating an intermediate potential that is applied to the gates of the first N-MOSFET, the second P-MOSFET, the third P-MOSFET and the third N-MOSFET; and the clamp circuit device of claim 1 that is connected to a common junction point of the first and the second P-MOSFETs and to a common junction point of the third and the fourth P-MOSFETs, respectively, and also connected to a common junction point of the first and the second N-MOSFETs and to a common junction point of the third and the fourth N-MOSFETs, respectively.

* * * * *